(12) United States Patent
Donley

(10) Patent No.: US 8,404,959 B2
(45) Date of Patent: Mar. 26, 2013

(54) THERMOELECTRIC DEVICE

(75) Inventor: William B. Donley, Carrollton, TX (US)

(73) Assignee: STMicroelectronics, Inc., Coppell, TX (US)

( * ) Notice: Subject to any disclaimer, the term of this patent is extended or adjusted under 35 U.S.C. 154(b) by 743 days.

(21) Appl. No.: 12/495,441

(22) Filed: Jun. 30, 2009

(65) Prior Publication Data

US 2010/0163089 A1 Jul. 1, 2010

Related U.S. Application Data

(60) Provisional application No. 61/142,111, filed on Dec. 31, 2008.

(51) Int. Cl.
*H01L 35/34* (2006.01)
*H01L 35/00* (2006.01)
*H01L 37/00* (2006.01)
*H01L 35/28* (2006.01)
*H01L 35/30* (2006.01)
*H01L 21/00* (2006.01)

(52) U.S. Cl. ........ 136/201; 136/200; 136/203; 136/205; 136/225; 438/54

(58) Field of Classification Search .......... 136/200–205; 438/54

See application file for complete search history.

(56) References Cited

U.S. PATENT DOCUMENTS

| | | | |
|---|---|---|---|
| 7,235,735 B2 | 6/2007 | Venkatasubramanian et al. | |
| 2005/0150536 A1 | 7/2005 | Ngai et al. | |
| 2007/0089773 A1 | 4/2007 | Koester et al. | |
| 2007/0256722 A1* | 11/2007 | Kondoh ........................ | 136/201 |

* cited by examiner

*Primary Examiner* — Jonathan Johnson
*Assistant Examiner* — Allison Bourke
(74) *Attorney, Agent, or Firm* — Seep IP Law Group PLLC

(57) ABSTRACT

A thermoelectric device includes a plurality of thin-film thermoelectric elements. Each thin-film thermoelectric element is a Seebeck-Peltier device. The thin-film thermoelectric elements are electrically coupled in parallel with each other. The thermoelectric device may be fabricated using conventional semiconductor processing technologies and may be a thin-film type device.

18 Claims, 3 Drawing Sheets

THERMOELECTRIC DEVICE

BACKGROUND

1. Technical Field

This disclosure generally relates to thermoelectric devices and more particularly to thermoelectric devices having a respective electrical current and a respective thermal gradient aligned approximately parallel or anti-parallel.

2. Description of the Related Art

Microprocessors, laser diodes, and other electronic devices generate heat during operation, which may adversely affect the performance of these devices. Electronic devices may be cooled by passive or active cooling systems. Passive cooling systems, which include heat sinks and heat pipes, dissipate heat. Design considerations in determining whether an electronic device can be cooled by a passive cooling system include the size requirement of the passive cooling system, the amount of ventilation at the passive cooling system, the operating temperature of the electronic device and the ambient temperature range where the device will be operated. Passive cooling systems might not be appropriate for many small electronic devices where the passive cooling system would require too much space or in devices where there is an insufficient amount of ventilation to dissipate the heat.

Active cooling systems may include refrigerators, e.g., mechanical vapor compression refrigerators, and thermoelectric coolers. Refrigeration based cooling systems generally require significant hardware such as a compressor, a condenser and an evaporator and require a relatively large amount of space. In addition, refrigeration based cooling systems include a large number of moving mechanical parts, which may be costly and which may require maintenance. In many electronic devices, it would be impractical and commercially non-viable to have refrigeration based cooling systems. Consumers may avoid purchasing an electronic device that needs to be maintained.

Active cooling systems also include thermoelectric cooling systems such as a Seebeck-Peltier (hereinafter "Seebeck") device. Seebeck devices provide cooling (or heating) by passing an electrical current through a thermoelectric device. A typical Seebeck thermoelectric device includes a layer of a Seebeck effect material, which conducts electricity, and another layer of an electrical conductor. When a voltage is applied across the terminals of a Seebeck thermoelectric device, heat is absorbed or produced at the interface of the Seebeck effect material and the other electrical conductor, depending on the direction of the electrical current flow.

Seebeck thermoelectric devices offer many advantages over refrigeration based cooling systems. Seebeck thermoelectric devices may be relatively small, have no moving parts, may be operated in harsh environments such as a vacuum, and may be operated in any orientation. Thus, Seebeck thermoelectric devices may be utilized for providing solid-state cooling of small electronic devices. However, current Seebeck thermoelectric devices require cumbersome electrical connections and are not as efficient for their size as some of the other cooling systems.

There is a need for improved Seebeck thermoelectric devices.

BRIEF SUMMARY

In one aspect, a thermoelectric device includes a support structure and a plurality of thin-film thermoelectric elements. The support structure includes electrically insulating frame members that have a number of openings. The thin-film thermoelectric elements are electrically coupled together in parallel. Each respective thin-film thermoelectric element has a respective electrically conductive member and a respective Seebeck effect member that is electrically coupled to the respective electrically conductive member, and each thin-film thermoelectric element is at least partially positioned within a respective one of the plurality of openings.

In another aspect, a method of manufacturing a thermoelectric device having multiple thin-film thermoelectric elements includes forming a layer of a first material at a plurality of thin-film thermoelectric element locations on a generally planar first surface of a substrate; forming a layer of a second material over at least the layer of the first material at the plurality of thin-film thermoelectric element locations. The first material is either a Seebeck effect material or an electrically conductive non-Seebeck effect material, and the second material is the other one of the Seebeck effect material or an electrically conductive non-Seebeck effect material. The method further includes physically isolating the respective layer of the first material at a respective thin-film thermoelectric element location from the respective layer of the first material at all of the other thin-film thermoelectric element locations for each thin-film thermoelectric element location; physically isolating the respective layer of the second material at a respective thin-film thermoelectric element location from the respective layer of the second material at all of the other thin-film thermoelectric element locations for each thin-film thermoelectric element location; and electrically coupling a plurality of thin-film thermoelectric elements in parallel, where each respective thin-film thermoelectric element of the plurality of thin-film thermoelectric elements is at a respective one of the plurality of thin-film thermoelectric element locations, and each respective thin-film thermoelectric element includes the respective layer of the first material and the respective layer of the second material at the respective thin-film thermoelectric element location.

In another aspect, a method of manufacturing a thermoelectric device having a plurality of thin-film thermoelectric elements includes forming a respective opening in a first surface of a generally planar substrate at a first plurality of thin-film thermoelectric element locations; and least partially filling each respective opening with a layer of a first material of a respective thin-film thermoelectric element, the first material being one of a Seebeck effect material or a first electrically conductive non-Seebeck effect material. The method further includes providing a layer of a second material of a respective thin-film thermoelectric element material at each one of the first plurality of thin-film thermoelectric element locations. The second material is the first electrically conductive non-Seebeck effect material when the first material is the Seebeck effect material, or the second material being the Seebeck effect material when the first material is the first electrically conductive non-Seebeck effect material. A respective thin-film thermoelectric element includes the first material and the second material at the respective thin-film thermoelectric element location of the respective thin-film thermoelectric element. The method further includes providing a layer of a second electrically conductive non-Seebeck effect material that physically couples the first plurality of thin-film thermoelectric elements together, the second electrically conductive non-Seebeck effect material physically connected to a respective bottom surface of each thin-film thermoelectric element of the first plurality of thin-film thermoelectric elements; and providing a layer of a third electrically conductive non-Seebeck effect material that physically couples the first plurality of thin-film thermoelectric elements together, the third electrically conductive non-Seebeck effect material physically connected to a respective top surface of each thin-film thermoelectric element of the first plurality of thin-film thermoelectric elements.

Figure 1:
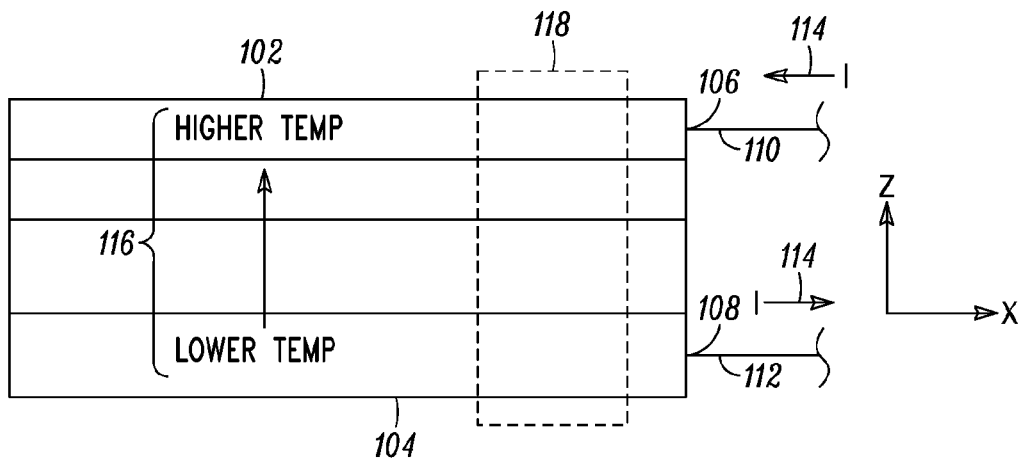
FIG. 1 is a schematic side view of a thermoelectric device according to one embodiment.

In the drawings, identical reference numbers identify identical elements or elements in the same group and class. The sizes and relative positions of elements in the drawings are not necessarily drawn to scale. For example, the shapes of various elements and angles are not necessarily drawn to scale, and some of these elements are enlarged and positioned to improve drawing legibility. Further, the particular shapes of the elements as drawn are not intended to convey any information regarding the actual shape of the particular elements and have been selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. Well-known structures associated with fabrication of semiconductor devices and/or with thermoelectric devices have not been shown or described in detail to avoid unnecessarily obscuring descriptions of the preferred embodiments.

Unless the context requires otherwise, throughout the specification and claims which follow, the word "comprise" and variations thereof, such as, "comprises" and "comprising" are to be construed in an open, inclusive sense, for example "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. The term "or" is generally employed in its sense including "and/or" unless the content clearly dictates otherwise.

The headings and Abstract of the Disclosure provided herein are for convenience only and do not interpret the scope or meaning of the embodiments.

FIG. 1 is a schematic side view of a thermoelectric device 100 according to one embodiment. The thermoelectric device 100 has an upper thermal surface 102 and a lower thermal surface 104. The upper thermal surface 102 may have heat dissipating fins (not shown) in one embodiment. The lower thermal surface 104 may be sized and shaped to thermally couple to a surface of an object (not shown). For example, the lower thermal surface 104 may be generally flat or planar and sized to couple to or contact a surface of a processor or micro-processor. Alternatively, the lower thermal surface 104 may curved and sized and shaped to couple to or contact a non-planar surface such as a cylindrical surface.

In some embodiments, the upper thermal surface 102 may be sized and shaped to have a surface area as large as or larger than the surface area of lower thermal surface 104 and may be sized and shaped to efficiently transfer thermal energy. For example, the upper thermal surface 102 may include one or more fins, e.g., relatively thin strips of a material such as a metal that extend outward from the upper thermal surface 102.

The thermoelectric device 100 includes terminals 106 and 108, each of which is connected to an electrical conductor 110, 112, respectively. An electrical current 114 is provided to the thermoelectric device 100 at the upper terminal 106, via electrical conductor 110. The electrical current 114 passes through the thermoelectric device 100 and exits at the lower terminal 108, where the electrical current 114 is conducted away from the thermoelectric device 100 via electrical conductor 112.

Passing the electrical current 114 through the thermoelectric device 100 produces a thermal gradient 116 between the upper and lower thermal surfaces 102, 104, respectively. In the embodiment shown in FIG. 1, the lower thermal surface 104 is at a temperature lower than the temperature of the upper thermal surface 102. If the direction of the electric current 114 is reversed such that the electric current 114 enters at terminal 108 and exits at terminal 106, then the direction of the thermal gradient 116 is reversed such that the lower thermal surface 104 would be at a temperature higher than the temperature of the upper thermal surface 102.

The direction of the thermal gradient 116 relative to the direction of current flow depends at least in part on materials used in the thermoelectric device 100. In other words, if one class of materials such as N-type doped Seebeck effect materials are used, then the temperature variations from higher to lower may be in the same direction of the as the current flow. However, if another class of materials such as P-type doped Seebeck effect materials are used, then the temperature variations from higher to lower may be in the opposite direction of the current flow.

Figure 2:
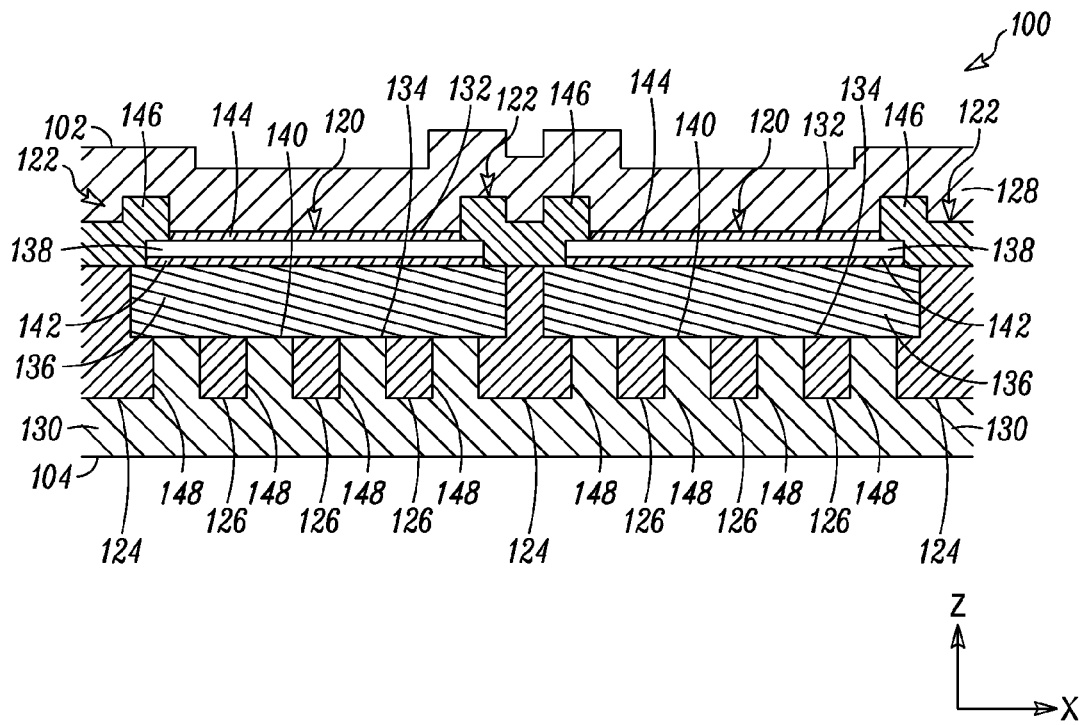
FIG. 2 is a cross sectional view of a portion of the thermoelectric device of FIG. 1 according to one embodiment.

FIG. 2 shows a cross-sectional view of a portion of the thermoelectric device 100 of FIG. 1. The dashed box 118 shown in FIG. 1 is representative of the portion of the thermoelectric device 100 shown in FIG. 2.

The thermoelectric device 100 includes a plurality of thin-film thermoelectric elements 120 and a support structure 122. The support structure 122 includes a plurality of frame members 124. The frame members 124 are spaced apart, and a plurality of legs 126 interpose adjacent frame members 124. The support structure may be formed from a sacrificial material such as a silicon wafer using various conventional semiconductor fabricating processes.

The thermoelectric device 100 further includes a layer of a first electrical terminal material 128 that forms upper thermal surface 102 of the thermoelectric device 100, and a layer of a second electrical terminal material 130 that forms the bottom thermal surface 104 of the thermoelectric device 100. The first electrical terminal material 128 and the second electrical terminal material 130 are electrically conductive and may be a metal or metal alloy such as, but not limited to, aluminum, copper, brass, etc.

A thin-film thermoelectric element 120 has an upper surface 132 and a bottom surface 134. The upper surface 132 and bottom surface 134 are generally planar and are approximately parallel to each other. Each one of the upper surface 132 and the bottom surface 134 has a respective surface area in the range of 25-2500 $\mu m^2$.

A thin-film thermoelectric element 120 includes a layer of a first electrically conductive material 136, and a layer of a Seebeck effect material 138. The layer of first electrically conductive material 136 may have a thickness in the range of 0.5-5 $\mu m$, and the Seebeck effect layer 138 may have a thickness in the range of 2,000-20,000 angstroms. The first electrically conductive material 136 may be a metal such as copper, aluminum, gold, and silver and/or other metals or metal alloys. The layer of first electrically conductive material 136 may be disposed in an opening 140 and may extend between adjacent frame members 124.

The frame members 124 may be formed from an electrically insulative material and may be formed such that the first electrically conductive material 136 of one thin-film thermoelectric element 120 is physically isolated from all other thin-film thermoelectric elements 120 by various frame members 124. The amount of the first electrically conductive material 136 deposited in one of the openings 140 is generally sufficient to at least partially or completely fill the respective opening 140 with the first electrically conductive material 136.

The Seebeck effect material 138 is a material such as P-type or N-type doped material, such as, but not limited to, Tellurium. All of the Seebeck effect material 138 is doped with the same type of dopant. Namely, it is either all P-type or N-type. This permits the Seebeck effect material to be doped in a single step, such as when they are first deposited or after they are formed and doped with a blanket implant. This saves process steps and cost as compared to having adjacent Seebeck effect materials doped with opposite conductivity type with respect to each other. Other Seebeck effect materials may be found in U.S. Publication 2005/0150536.

In some embodiments, a thin-film thermoelectric element 120 may include a layer of an optional electrically conductive barrier material 142 interposing the Seebeck effect material 138 and the first electrically conductive material 136. Depending on materials selected for the first electrically conductive material 136 and the Seebeck effect material 138, there may be an undesirable interaction such as a chemical reaction and/or electromigration therebetween. The electrically conductive barrier layer 142, if present, will coat a top surface of the first electrically conductive material 136 (and/or a bottom surface of the Seebeck effect material 138) so as to prevent and/or inhibit undesirable interactions between the Seebeck effect material 138 and the first electrically conductive material 136. The electrically conductive barrier layer 142, if present, may be substantially chemically inert with one or the other or both of the Seebeck effect material 138 and the first electrically conductive material 136.

Similarly, the materials selected for the first electrical terminal material 128 and the Seebeck effect material 138 may undesirably interact. In that case, a layer of an electrically conductive barrier material 144 may interpose the first electrical terminal material 128 and the Seebeck effect material 138. The electrically conductive barrier material 144, if present, will coat an upper surface of the Seebeck effect material 138 (and/or a bottom surface of first electrical terminal material 128) so as to prevent and/or inhibit undesirable interactions between the Seebeck effect material 138 and the first electrical terminal material 128. In that case, the electrically conductive barrier material 144 forms the upper surface 132 of the thin-film thermoelectric element 120. The electrically conductive barrier layer 144, if present, may be substantially chemically inert with one or the other or both of the Seebeck effect material 138 and the first electrical terminal material 128.

Nonlimiting examples of materials that may be used for the electrically conductive barrier materials 142, 144 include Ta, TaN, Pt, and TiW. The electrically conductive barrier layer 142, 144 are generally a thin film, if present in the thermoelectric device 100.

The thermoelectric device 100 further includes a plurality of frame caps 146. The frame caps 146 extend generally transversely and longitudinally above the frame members 124. The frame caps 146 may be formed and shaped such that the Seebeck effect material 138 of one thin-film thermoelectric element 120 is physically isolated from all other thin-film thermoelectric elements 120. The frame caps 146 may be an electrically insulative material such as, but not limited to, silicon dioxide, silicon nitride, polyimide, etc.

The layer of first electrical terminal material 128 is disposed over the thin-film thermoelectric elements 120 and generally over the support structure 122 including the frame caps 146. The first electrical terminal material 128 electrically couples each thin-film thermoelectric element 120 of the thermoelectric device 100 in parallel at the respective upper surfaces 132. The first electrical terminal material 128 may be a metal such as aluminum, copper, gold, silver, brass alloy, or other electrical conductor.

The support structure 122 includes a plurality of openings 148. A respective opening extends between adjacent legs 126 or between a frame member 124 and a leg 126 adjacent thereto. The layer of second electrical terminal material 130 is disposed beneath the support structure 122 and fills the plurality of openings 148. The second electrical terminal material 130 is in physical and electrical contact with the bottom surface 134 of each thin-film thermoelectric element 120. The second electrical terminal material 130 electrically couples each thin-film thermoelectric element 120 of the thermoelectric device 100 in parallel at the respective bottom surfaces 134.

FIGS. 3A-3E show a process for manufacturing a thermoelectric device 100 according to one embodiment. The thermoelectric device 100 may be formed using conventional semiconductor processing techniques such as, but not limited to, physical vapor deposition, chemical vapor deposition, e-beam evaporation, contact lithography, UV stepper, masking, and etching, e.g., plasma etch, wet etch.

Figure 3A:
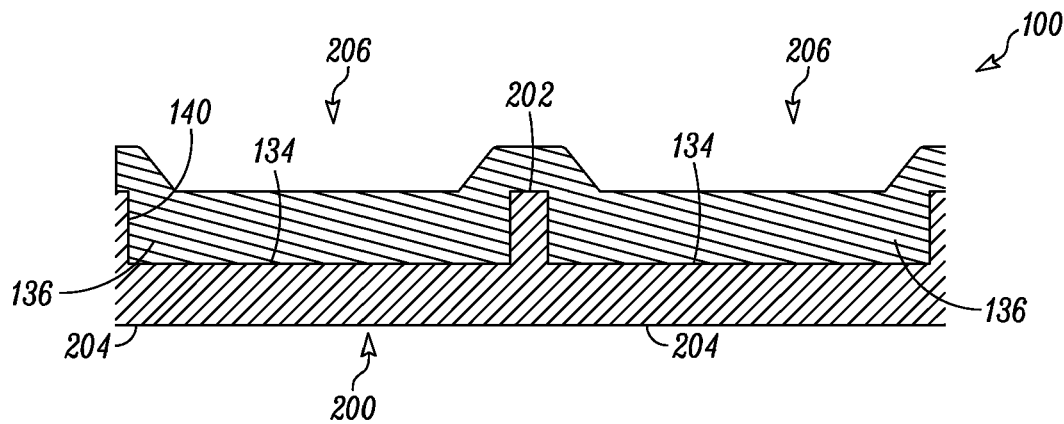
FIGS. 3A-3E are cross sectional views of portion of a thermoelectric device during various stages of manufacture according to one embodiment.

A substrate 200 such as an undoped silicon wafer is shown in FIG. 3A. The substrate 200 includes a first surface 202 and a second surface 204. Prior to patterning the substrate 200, the first and second surfaces 202, 204 are generally parallel and planar. After patterning the substrate 200, the first surface 202 has a plurality of thin-film thermoelectric element locations 206 formed therein. Each thin-film thermoelectric element location 206 includes an opening 140 extending from the first surface 202 inward toward the second surface 204 of the thin-film thermoelectric element. The openings 140 may be formed in the substrate 200 via conventional semiconductor fabrication processes such as chemical etching.

The openings 140 are etched into the substrate to a desired depth. After the openings 140 have been formed in the substrate 200, a layer of the first electrically conductive material 136 is formed over the substrate 200 at least partially filling each opening 140 and covering the first surface 202 of the substrate 200. In one embodiment, the first electrically conductive material 136 completely fills each one of the openings 140. Portions of the first electrically conductive material 136 are selectively removed such as by chemical mechanical polishing processing so that each portion of the first electrically conductive material 136 in a respective opening 140 is electrically and physically isolated from all other portions of first electrically conductive material 136 in other openings 140.

Figure 3B:
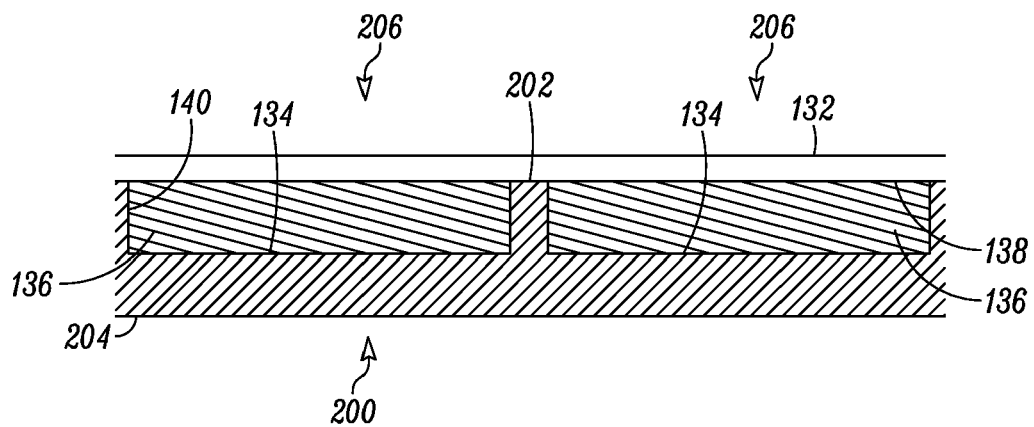

As shown in FIG. 3B, a layer of the Seebeck effect material 138 is formed over the etched electrically conductive material 136. The Seebeck effect material 138 covers the first surface 202 of the substrate 200 and the remaining portions of the first electrically conductive material 136. Portions of the Seebeck effect material 138 are selectively removed such that the Seebeck effect material 138 at a respective thin-film thermoelectric element location 206 is physically isolated from the Seebeck effect material 138 at adjacent thin-film thermoelectric element locations 206, as shown in FIG. 3C.

In some embodiments, after patterning the first electrically conductive material 136 and prior to forming the layer of Seebeck effect material 138, a layer of the electrically conductive barrier material 142 (see FIG. 2) may be formed over the substrate 200 and the first electrically conductive material 136 so as to cover the patterned electrically conductive material 136 and the exposed portions of the first surface 202 of the substrate 200. The layer of electrically conductive barrier material 142 is then patterned such that selective portions of the electrically conductive barrier material 142 are removed. The removed portions generally correspond to portions of the electrically conductive barrier material 142 outside of the respective thin-film thermoelectric element locations 206. Then, the layer of Seebeck effect material 138 is formed over the substrate 200, the first electrically conductive material 136, and the electrically conductive barrier material 142. Next, the layer of Seebeck effect material 138 is patterned to remove portions of the Seebeck effect material that are outside of the respective thin-film thermoelectric element locations 206.

Figure 3C:
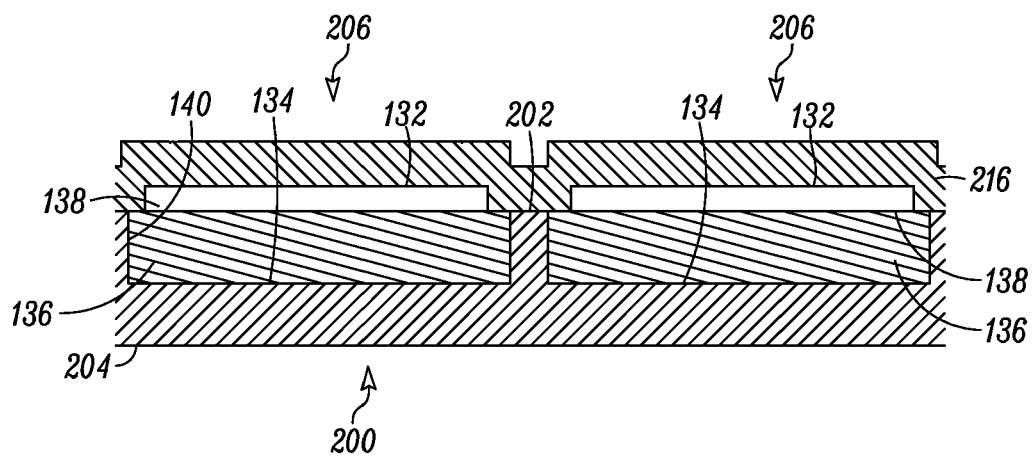

As shown in FIG. 3C, after patterning and removing portions of the layer of Seebeck effect material 138, a layer of an electrically insulative material 216 is formed over the exposed portions of the first surface 202 of the substrate 200 and the remaining portions of the layer of Seebeck effect material 138. The layer of electrically insulative material 216 may be a material such as a polyimide or silicon dioxide or silicon nitride or other electrically insulative materials. Portions of the layer of electrically insulative material 216 are selectively removed. The removed portions are generally removed from inside of the thin-film thermoelectric element locations 206. The layer of electrically insulative material 216 is patterned and etched to form the frame caps 146 (see FIG. 3D).

In some embodiments, the layer of electrically insulative material 216 may be patterned and etched to be generally planar. In that case, the frame caps 146 may be generally flush with the layer of Seebeck effect material 138 or may extend above the layer of Seebeck effect material 138.

Figure 3D:
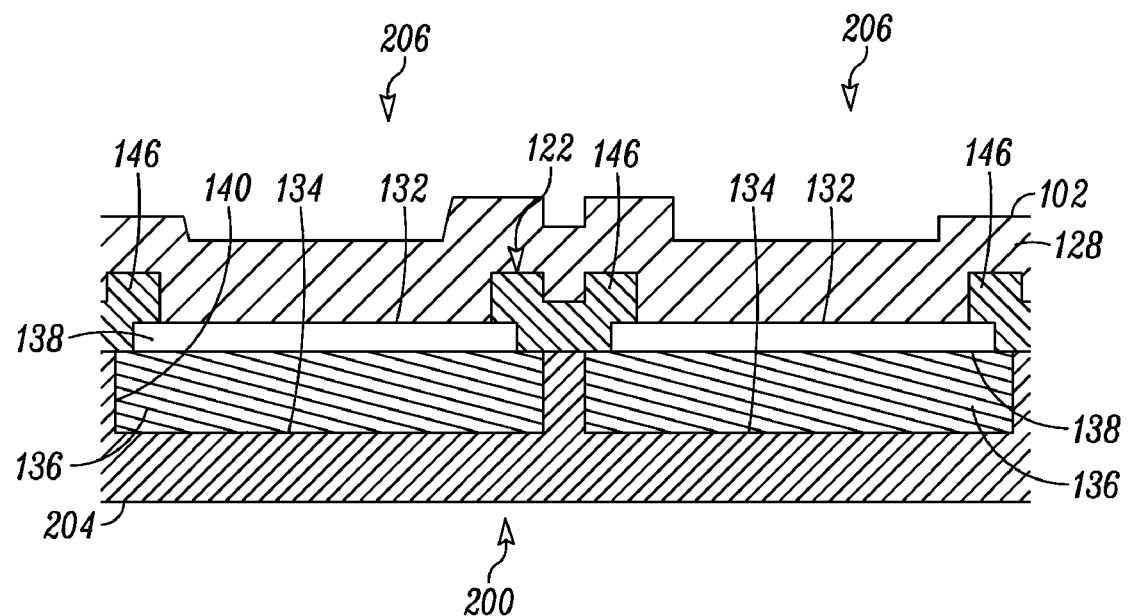

As shown in FIG. 3D, after forming the frame caps 146, the layer of first electrical terminal material 128 is formed over the frame caps 146 and the layer of Seebeck effect material 138. The first electrical terminal material 128 is in physical and electrical contact with the Seebeck effect material 138 at each thin-film thermoelectric element location 206 in one embodiment.

In some embodiments, after forming the frame caps 146 and prior to forming the layer of first electrical terminal material 128, a layer of a barrier material 144 (see FIG. 2) may be formed over the frame caps 146 and the Seebeck effect material 138 thereby covering the frame caps 146 and the exposed portions of the Seebeck effect material 138. The layer of barrier material 144 is then patterned such that selective portions of the barrier material 144 are removed. The removed portions generally correspond to portions of the barrier material outside of respective thin-film thermoelectric element locations 206 such that portions of the frame caps 146 are exposed and such that the barrier material 144 inside of one of the respective thin-film thermoelectric element locations 206 is physically isolated from barrier material in other thin-film thermoelectric element locations 206. Then, the first electrical terminal material 128 is formed over the substrate 200. In this embodiment, the barrier material 144 provides electrical contact between the Seebeck material 138 and the conductive layer 128.

Figure 3E:
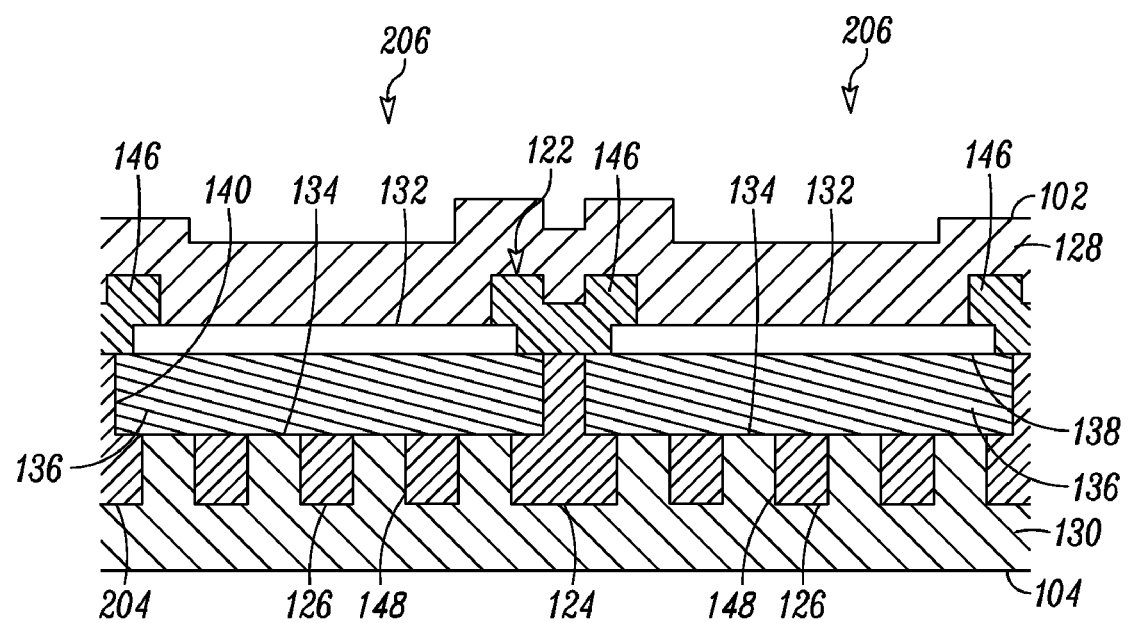

As shown in FIG. 3E, the second surface 204 of the substrate 200 is patterned and selective portions of the substrate 200 are removed therefrom to form the openings 148, which extend from the second surface 204 of the substrate 200 to the thin-film thermoelectric element location bottom surface 134 of the respective thin-film thermoelectric element locations 206. After the openings 148 are formed, the remaining portions of the second surface 204 of the substrate 200 is coated with the second electrical terminal material 130. The second electrical terminal material 130 covers the second surface 204 of the substrate 200 and at least partially fills the openings 148. The second electrical terminal material 130 electrically couples together the respective bottom surfaces 134 of the thin-film thermoelectric elements 120 together. In operation, current flows from the second electrical terminal 130 to the first electrical terminal 128. Electrical voltage connections are provided (not shown) to cause current to flow in this direction. Heat therefore flows from the top to the bottom, causing the top to cool and the bottom to heat for a P-type Tellurium Seebeck material. If it is desired to have the bottom cool and the top to heat, the direction of the current can be reversed or the Seebeck material can be doped N-type.

By having only one doping type of Tellurium, a larger portion of the substrate is Tellurium and efficient cooling is achieved. Much fewer masting steps are also needed than if two types of doped Tellurium are used and the electrical terminals are both on the top surface.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ systems and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a thermoelectric device, comprising:
   forming a plurality of first material portions at a plurality of thin-film thermoelectric element locations;
   forming a plurality of second material portions on the first material portions, respectively, wherein the first material portions are of a Seebeck effect material or an electrically conductive non-Seebeck effect material, the second material portions are of the Seebeck effect material if the first material portions are of the electrically conductive non-Seebeck effect material, and the second material portions are of the electrically conductive non-Seebeck effect material if the first material portions are of the Seebeck effect material;
   physically isolating the first material portions from each other;
   physically isolating the second material portions from each other; and
   electrically coupling a plurality of thin-film thermoelectric elements in parallel, wherein each respective thin-film thermoelectric element of the plurality of thin-film thermoelectric elements includes a respective one of the first material portions and a respective one of the second material portions, the electrically coupling including forming a first electrode electrically coupling the first material portions to each other and forming a second electrode, contacting second material portions and electrically coupling the second material portions to each other and wherein the second electrode is a continuous material over the plurality of second material portions, each of the thin-film thermoelectric elements being positioned between the first and second electrodes.

2. The method of claim 1 wherein forming the first electrode includes:
   covering the plurality of thin-film thermoelectric elements with a first electrically conductive non-Seebeck effect material layer.

3. The method of claim 1, further comprising:
   forming, between the first and second material portions of one of the thin-film thermoelectric elements, a barrier layer that is substantially chemically inert with at least one of the first and second material portions of the one of the thin-film thermoelectric elements.

4. The method of claim 1, wherein:
   forming the second material portions includes forming a continuous layer of the Seebeck effect material on the first material portions; and
   physically isolating the second material portions from each other includes:
   selectively removing at least a portion of the layer of the Seebeck effect material that is between adjacent thin-film thermoelectric element locations.

5. The method of claim 4 wherein a gap extends between adjacent thin-film thermoelectric element locations after selectively removing the at least a portion of the layer of the Seebeck effect material, and further including:
   forming an electrically insulative material in the gap.

6. The method of claim 4, further comprising:
   forming respective openings in a surface of a substrate at the thin-film thermoelectric element locations, respectively, prior to forming the first material portions in the openings, respectively.

7. The method of claim 1, wherein:
   forming the first material portions at the plurality of thin-film thermoelectric element locations includes forming the first material portions on a first surface of a substrate; and
   forming the first electrode includes:
   forming a plurality of openings completely through the substrate from a second surface to the first surface, wherein each opening exposes a bottom surface of a respective one of the thin-film thermoelectric elements; and
   depositing a conductive layer that at least partially fills each one of the openings and at least partially covers the second surface of the substrate such that the bottom surfaces of the thin-film thermoelectric elements are electrically coupled together by the conductive layer.

8. A method of manufacturing a thermoelectric device, comprising:
   forming a plurality of first openings in a surface of a substrate at a plurality of thin-film thermoelectric element locations, respectively;
   forming first material portions of respective thin-film thermoelectric elements in the first openings, respectively, the first material portions being of a Seebeck effect material or an electrically conductive non-Seebeck effect material;
   forming second material portions of the respective thin-film thermoelectric elements at the plurality of thin-film thermoelectric element locations, respectively, the second material portions being of the electrically conductive non-Seebeck effect material if the first material portions are of the Seebeck effect material, and the second material portions being of the Seebeck effect material if the first material portions are of the electrically conductive non-Seebeck effect material;
   providing a first conductive electrode layer that physically and electrically couples the plurality of thin-film thermoelectric elements together, the first conductive electrode layer being physically and electrically coupled to a respective bottom surface of each thin-film thermoelectric element of the plurality of thin-film thermoelectric elements; and
   providing a second conductive electrode layer that physically and electrically couples the plurality of thin-film thermoelectric elements together and contacts the thin-film thermoelectric elements and, the second conductive electrode layer is a continuous material and is physically and electrically coupled to a respective top surface of each thin-film thermoelectric element of the plurality of thin-film thermoelectric elements, and each thin-film thermoelectric element being positioned between the first and second conductive electrode layers.

9. The method of claim 8 comprising:
   forming a gap between adjacent second conductive portions of the plurality of thin-film thermoelectric elements; and
   at least partially filling the gap with an electrically insulative material.

10. The method of claim 8 comprising:
    slicing the substrate into a plurality of dies, each die including a respective thermoelectric device having a respective subset of the plurality of thin-film thermoelectric elements.

11. The method of claim 8 comprising:
    forming a plurality of second opening extending through the substrate at the plurality of thin-film thermoelectric element locations, respectively.

12. The method of claim 11 wherein providing the second conductive electrode layer includes extending leg portions of the second conductive electrode layer through the second openings, respectively, the leg portions contacting the first conductive portions, respectively.

13. A method of making a thermoelectric device, comprising:
forming a support structure having electrically insulating frame members defining a plurality of openings;
forming a plurality of thin-film thermoelectric elements in the openings, respectively, each thin-film thermoelectric element having a respective electrically conductive member and a respective Seebeck effect member that is electrically coupled to the respective electrically conductive member;
a first conductive electrode positioned on a first side the support structure and electrically contacting the plurality of thin-film thermoelectric elements; and
a second conductive electrode positioned on a second side of the support structure and is physically and electrically contacting the plurality of thin-film thermoelectric elements and wherein the second conductive electrode is a continuous material over the plurality of thin-film thermoelectric elements, each thin-film thermoelectric element being positioned between the first and second conductive electrodes and being electrically coupled in parallel by the first and second conductive electrodes.

14. The method of claim 13, wherein each thin-film thermoelectric element has generally planar opposite first and second surfaces, the respective first surfaces being generally aligned in a first plane, the respective second surfaces being generally aligned in a second plane that is generally parallel to the first plane, wherein the first conductive electrode electrically contacts the respective first surface of each thin-film thermoelectric element and the second conductive electrode electrically contacts the respective second surface of each thin-film thermoelectric element.

15. The method of claim 13, wherein the respective Seebeck effect member of each respective thin-film thermoelectric element is a p-doped semiconductor material.

16. The method of claim 13, wherein each respective electrically conductive member is physically separated from all other respective thin-film thermoelectric elements by at least one of the electrically insulating frame members of the support structure.

17. The method of claim 13, wherein:
forming the support structure includes:
forming openings in a substrate, the openings in the substrate being separated from one another by respective frame members of the substrate; and
forming insulator members on the frame members of the substrate, respectively, each frame member of the support structure including a respective one of the frame members of the substrate and a respective one of the insulator member.

18. The method of claim 17, wherein forming the plurality of thin-film thermoelectric elements includes:
forming the electrically conductive members in the openings in the substrate, respectively; and
forming the Seebeck effect members on the electrically conductive members, respectively, before forming the insulator members between the Seebeck effect members.

* * * * *